United States Patent [19]

Mlavsky et al.

[11] 4,045,246
[45] Aug. 30, 1977

[54] SOLAR CELLS WITH CONCENTRATORS

[75] Inventors: Abraham I. Mlavsky, Lincoln, Mass.; Roland Winston, Chicago, Ill.

[73] Assignee: Mobil Tyco Solar Energy Corporation, Waltham, Mass.

[21] Appl. No.: 603,276

[22] Filed: Aug. 11, 1975

[51] Int. Cl.[2] ............................................. H01L 31/04
[52] U.S. Cl. ............................ 136/89 PC; 126/270; 126/271
[58] Field of Search ............... 136/89, 206, 89 PC; 126/270, 271; 350/293

[56] References Cited

U.S. PATENT DOCUMENTS

| | | | |
|---|---|---|---|
| 2,402,662 | 6/1946 | Ohl | 136/89 |
| 2,946,945 | 7/1960 | Regnier et al. | 320/2 |
| 3,229,682 | 1/1966 | Perlmutter et al. | 126/270 |
| 3,490,950 | 1/1970 | Myer | 136/89 |
| 3,923,381 | 12/1975 | Winston | 350/293 |
| 3,957,031 | 5/1976 | Winston | 126/270 |
| 3,985,116 | 10/1976 | Kapany | 126/270 |
| 3,988,166 | 10/1976 | Beam | 136/89 |
| 4,002,499 | 1/1977 | Winston | 136/206 |

OTHER PUBLICATIONS

W. A. Beckmann et al., "Design Considerations for a 50-Watt Photovoltaic Power System Using Concentrated Solar Energy," *Solar Energy* vol. 10, No. 3, pp. 132-136 (1966).
R. Winston, "Principles of Solar Concentrators of a Novel Design," *Solar Energy*, vol. 16, pp. 89-95 (1974).
B. H. Beam et al. "Experiments on Solar Photovoltaic Power Generation Using Concentrator and Liquid Cooling," Proc. 11th IEEE Photovoltaic Specialists Conference, Scottsdale, Ariz., May 6-8, 1975, pp. 332-337.
Chemical & Engineering News, July 21, 1975, p. 16.
Chemical & Engineering News, Aug. 5, 1974, pp. 18-20.

*Primary Examiner*—John H. Mack
*Assistant Examiner*—Aaron Weisstuch
*Attorney, Agent, or Firm*—Schiller & Pandiscio

[57] ABSTRACT

The invention provides a unique arrangement for cooling solar cells that are associated with collectors for collecting solar radiation and concentrating the same on the solar cells. The solar energy concentrators are each characterized by having a chamber with a solar radiation transmissive entrance wall, sidewalls adapted to concentrate solar radiation, one or more solar cells disposed in each chamber, and means for passing a dielectric, transparent cooling fluid through each chamber. The cooling fluid has an index of refraction which promotes solar energy concentration onto the solar cells in addition to that provided by the sidewalls.

12 Claims, 11 Drawing Figures

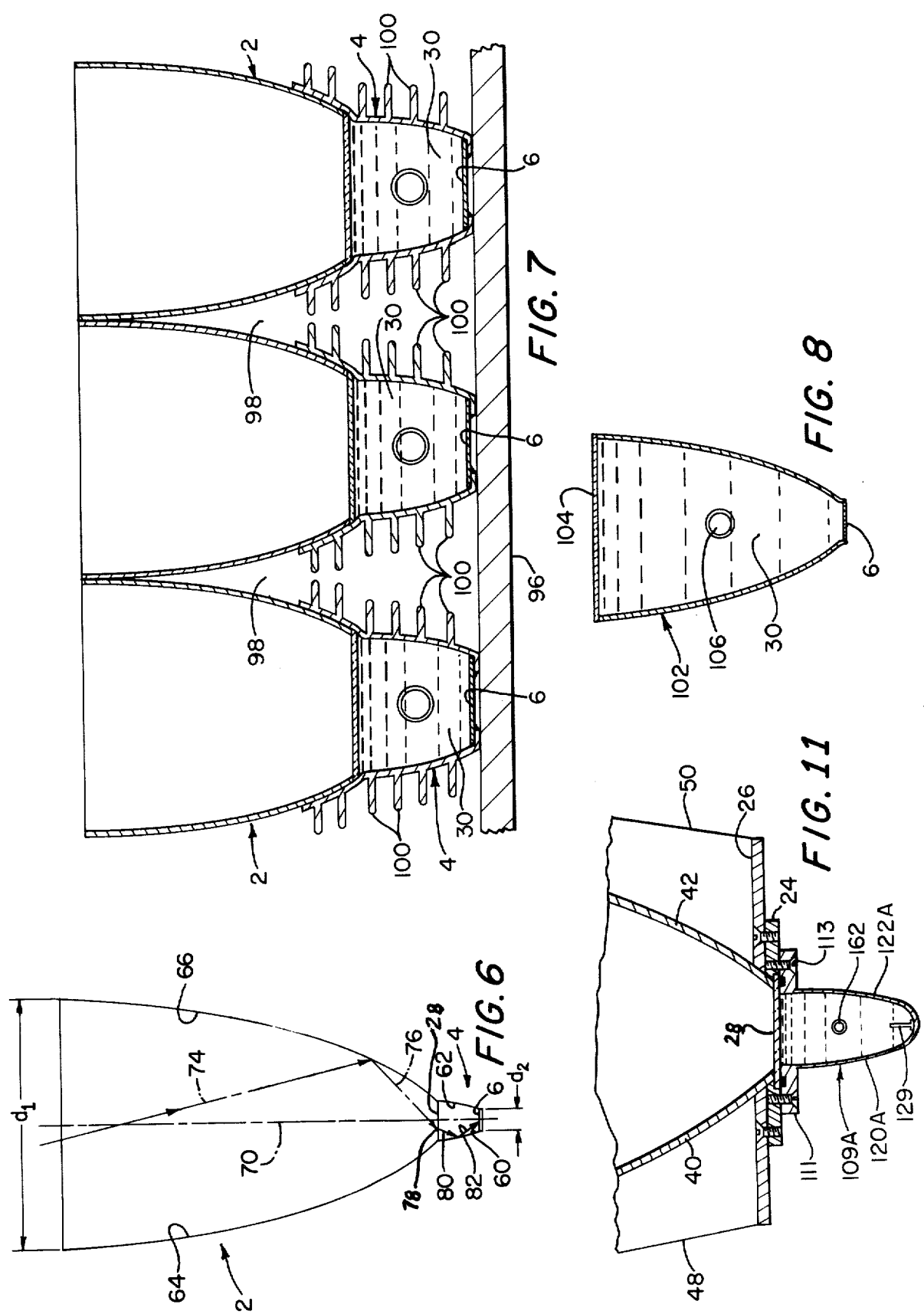

SOLAR CELLS WITH CONCENTRATORS

This invention relates to apparatus for converting solar energy to electricity and more particularly to improved solar cell apparatus of the type designed to convert solar energy to electrical energy.

As is well known, solar cells capable of directly converting solar energy to electrical energy, e.g., silicon P-N junction solar cells, tend to undergo a loss of conversion efficiency if subjected to heat. Solar cells tend to heat up as a result of adsorption of radiation by the solar cells or associated structure and also due to IR losses. Hence it is desirable to provide cooling means for maintaining the solar cells at a temperature which is acceptable with respect to maintaining conversion efficiency. Cooling the solar cell apparatus also helps avoid undue stressing of mechanical components due to thermal expansion and contraction. This latter reason for cooling is important since it is standard practice to electrically interconnect a plurality of solar cells in series and/or in parallel for the purpose of achieving a selected output voltage and/or current. Furthermore, for practical solar power plants, it may be necessary or desirable to employ light collectors for collecting solar radiation and concentrating it on selected surfaces of the solar cell apparatus.

Therefore, the primary object of this invention is to provide solar cell apparatus of the character described which comprises a unique arrangement for concentrating solar radiation and cooling the solar cell or cells.

A further object is to provide a solar cell apparatus with a radiant energy concentrator assembly which includes means for cooling the solar cell or cells.

Still another object is to provide apparatus comprising one or more solar cells, means for concentrating radiant energy onto the cells, and means for disposing a cooling fluid in a heat-exchange relation with the solar cells.

A further object is to provide apparatus for converting solar radiation to electrical energy which comprises a plurality of solar cells and concentrators disposed in a predetermined manner, and means forming part of the concentrators for directing a cooling fluid to contact the solar cells.

These objects and other objects and advantages hereinafter set forth or rendered obvious are achieved by providing an apparatus which comprises one or more solar energy concentrators which are characterized by a chamber having a wall which is made of a material capable of passing solar radiation, one or more solar cells disposed in each chamber, and means for passing a dielectric cooling fluid through each chamber so as to effect cooling of the solar cell or cells, the cooling fluid being capable of passing solar radiation and having an index of refraction which promotes concentration of the solar energy onto the solar cells.

Other features and advantages of the invention are disclosed or rendered obvious by the following detailed description which is to be considered together with the accompanying drawings wherein:

FIG. 6 is a schematic cross-sectional view illustrating the path followed by a single ray of solar energy in the apparatus of FIG. 1;

FIG. 7 is a cross-sectional view of a battery of solar cell-concentrator assemblies constituting a modification of the invention; and FIGS. 8–11 are cross-sectional views of additional modifications of the invention.

In the drawings, like numerals refer to like parts.

Figure 1:
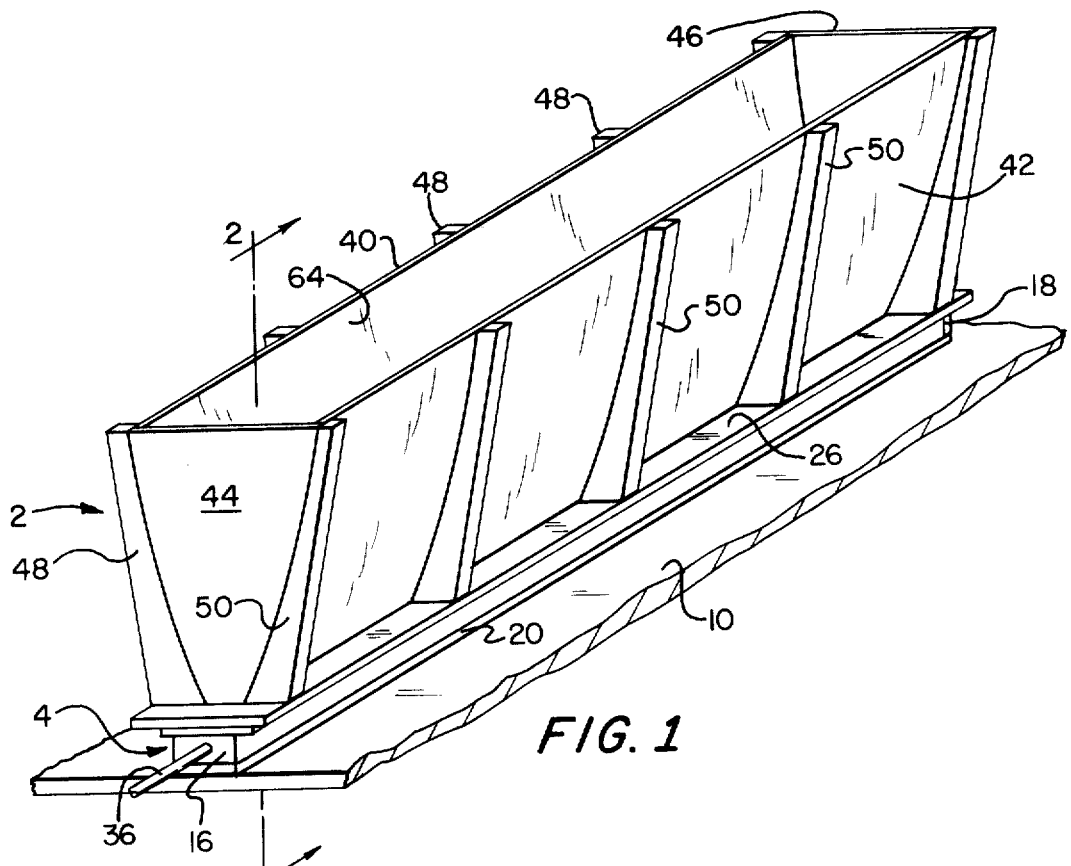
FIG. 1 is a perspective view of a preferred embodiment of the invention.

Referring now to FIGS. 1-4, the illustrated apparatus comprises first and second trough-like radiant energy concentrators 2 and 4 respectively disposed one above the other, and a flat solar cell panel 6 which is assumed to comprise an array of solar cells 8 disposed at the exit aperture of concentrator 4. The foregoing apparatus is positioned on and secured to a mounting plate 10.

The lower concentrator 4 comprises opposite side wall members 12 and 14 and end wall members 16 and 18 which are secured by screws to a bottom wall member 20. The latter has a groove 22 extending longitudinally thereof between side wall members 12 and 14 and mounted in the groove 22 is the flat panel 6 of solar cells 8. Attached by screws to the flat upper surfaces of side wall members 12 and 14 and end wall members 16 and 18 is a flat elongate mounting plate 24. The latter has a rectangular opening therein whose length is almost exactly the same as the distance between end wall members 16 and 18 and whose width is slightly greater than the distance between the confronting inner edge of the upper surfaces of side wall members 12 and 14. At its inner edges which define this rectangular opening, the plate 24 is undercut to form a recess to receive the four edges of a rectangular glass or plastic plate 28 which is capable of passing solar radiation. The transparent plate 28 is held by mounting plate 24 down against the upper surfaces of wall members 12, 14, 16 and 18 and coacts with the latter and bottom wall member 20 to form a closed trough-like chamber capable of being filled with a selected cooling fluid 30. Resilient gaskets 32 and 34 are interposed between wall members 12, 14, 16 and 18 on the one hand and plate 28 and bottom wall member 20 on the other hand to prevent leakage of fluid 30 from the chamber. Although not shown, it is to be understood that additional gaskets may be interposed between each of the end wall members 16 and 18 and the confronting end surfaces of wall members 12 and 14 to further assure against leakage of fluid. However, end wall members 16 and 18 are fitted with ports to which are connected conduits 36 and 38 respectively for use in circulating fluid through the lower concentrator.

The upper concentrator comprises two opposite side wall members 40 and 42, and two end wall members 44 and 46. The end wall members are secured to the side wall members and the latter are secured to and braced by two groups of cant frame members 48 and 50 which are attached to a mounting plate 26 that overlies and is secured to plate 24. Plate 26 has a rectangular opening that is similar to and aligned with the rectangular opening in plate 24. As is apparent, the wall members 40, 42, 44 and 46 also form a trough-like chamber which is open at the top but closed off at the bottom by transparent plate 28.

The solar cells 8 which form part of the panel 6 are flat semiconductor type units and are not shown in detail since such units are well known in the art. By way of example, the photocells may be silicon P-N junction or cadmium sulfide type solar cells. Other types of flat solar cells also may be used. As is well known (see U.S. Pat. Nos. 3,359,137, 3,489,615, 3,686,036, 3,713,893 and 3,811,954), it is customary to provide a grid of current collectors on that surface of the solar cell which is to receive solar radiation. Typically, the grid consists of a plurality of parallel relatively narrow conductors intersected by one or more relatively wide conductors, as represented schematically at 52 in FIG. 3. While the panel 6 may support a single solar cell extending for substantially the full length of the lower concentrator, preferably it supports a number of solar cells as shown which are electrically interconnected in series and/or parallel according to the power requirements. Electrically interconnecting an array of solar cells is old in the art as disclosed by U.S. Pat. Nos. 3,849,880, 3,713,893, 3,457,427, 3,574,925, 3,502,507, and 3,819,417. The solar cells are connected to an exterior circuit by suitable means as, for example, by a pair of insulated leads 54 which terminate in an electrical connector 56 of suitable design which is attached to bottom wall member 20 and is adapted to receive a mating connector that forms part of the exterior circuit. A non-conducting potting compound 58 is applied to seal off the opening in bottom wall member 20 through which the terminal leads extend.

The wall members of the upper and lower concentrators may be made of various materials such as metal, wood or plastic. However, the inner surfaces of the wall members must be capable of acting as reflectors for solar radiation. This light-reflecting capability may be achieved by applying a silver coating to the inner surfaces of the wall members. Preferably, however, the wall members are made of aluminum and their inner surfaces are highly polished to a mirror finish.

Figure 2:
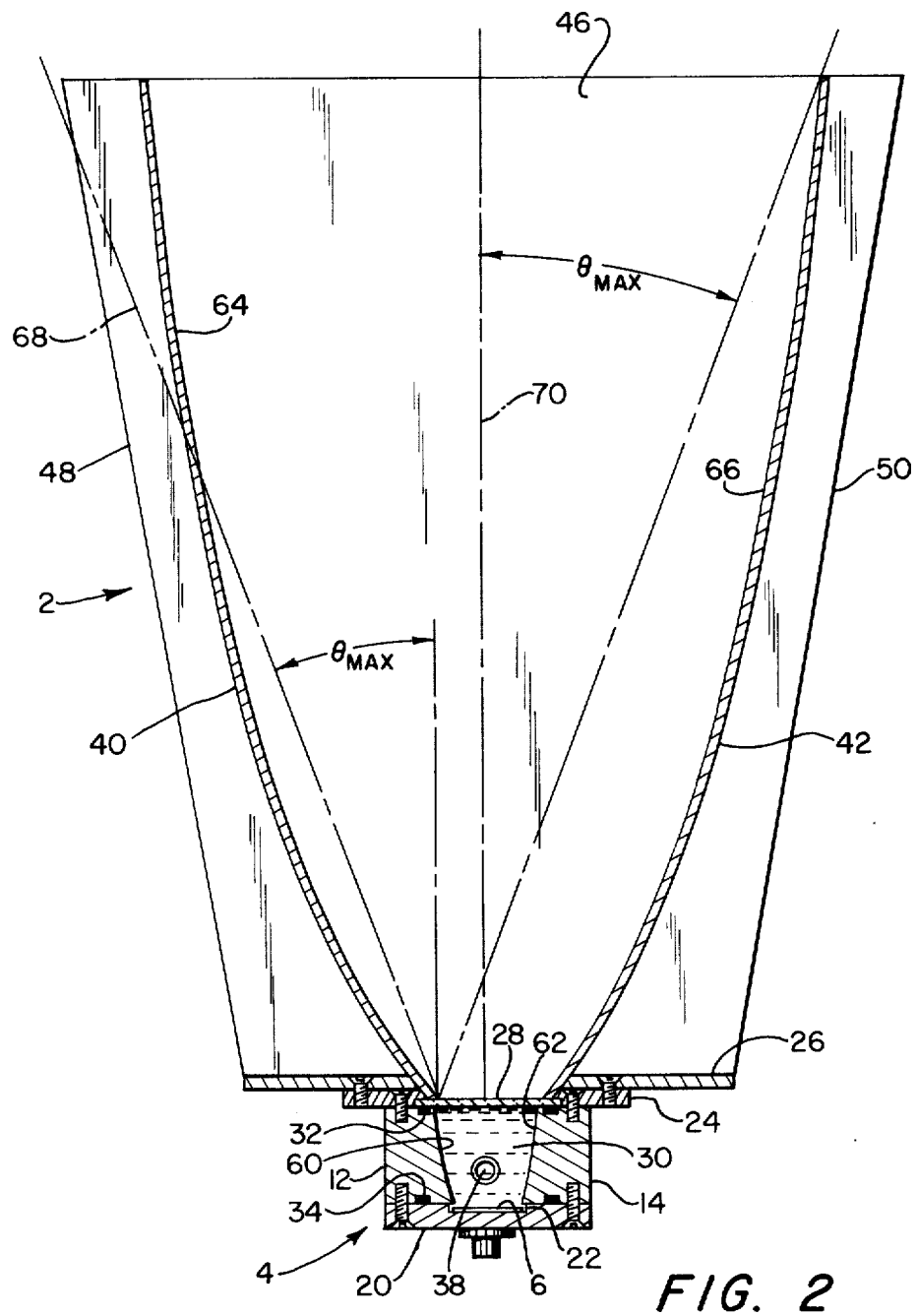
FIG. 2 is a cross-sectional view of the apparatus of FIG. 1.
Figure 4:
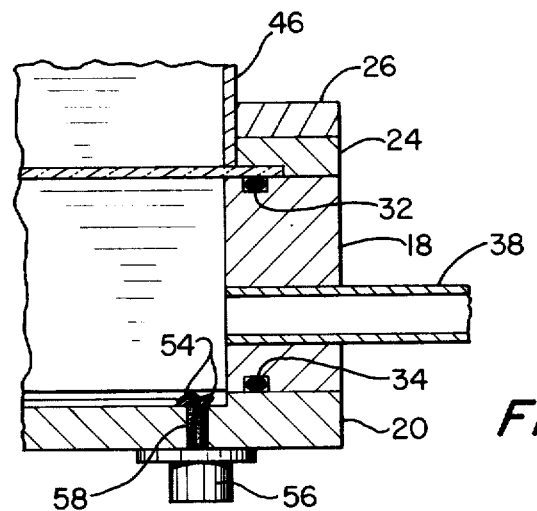
FIG. 4 is a longitudinal sectional view of one end of the same apparatus.

Referring to FIGS. 2 and 4, the inner surfaces of the two concentrators preferably are shaped in accordance with the teachings set forth by Dr. Roland Winston, *Principles of Solar Concentrators of a Novel Design,* Solar Energy, Vol 16, pp, 89-95, Pergamon Press, 1974. Accordingly, the inner surfaces of end wall members 16, 18, 44 and 46 are flat and extend at a right angle to both the plane of the solar cell supporting panel 6 and the longitudinal axis of groove 22, while the inner surfaces 60, 62 64 and 66 of side wall members 12, 14, 40 and 42 respectively each have a predetermined profile curvature. The upper and lower end edges of the inner surfaces of wall members 40, 42, 44 and 46 respectively define the entrance and exit apertures of the upper concentrator and the upper and lower edges of the inner surfaces of the side and end wall members 12, 14, 16 and 18 define the entrance and exit apertures respectively of the lower concentrator. In this connection it is to be noted that the dimensions of the entrance aperture of the lower concentrator are equal to or greater than the corresponding dimensions of the exit aperture of the upper concentrator so as to maximize transmission of radiant energy into the lower concentrator.

Referring now to FIG. 2, the predetermined profile curvature of the inner surface of side wall member 42 is a mirror image of the corresponding surface of side wall member 40. The predetermined profile curvature of each of said inner surfaces is that of a parabola with its focus at the opposite edge of the exit aperture and its axis (identified as 68 for wall member 42) inclined at an angle $\theta_{max}$ with respect to the center or optic axis 70 of the upper concentrator. At the upper edge of each inner surface, the tangent to the parabola is parallel to center axis 70. Considering solar radiation as a divergent beam of light, the angle $\theta_{max}$ is the half angle of maximum light beam divergence. The maximum permissible concentration factor (ratio of entrance aperture width $d_1$ to exit aperture width $d_2$) of the upper concentrator may be shown to be:

$$d_1/d_2 = 1/\sin\theta_{max} \qquad (1)$$

The height L of the concentrator is made just sufficient to transmit direct rays from the entrance to the exit aperature at angle $\theta_{max}$. More specifically, the length of the collector is made to satisfy the following relation:

$$L = (\tfrac{1}{2})(d_1 + d_2)\cot\theta_{max} \qquad (2)$$

The profile curvature of each of the surfaces 60 and 62 is designed to satisfy relations analogous to (1) and (2) above, where $d_1$ and $d_2$ are the entrance and exit apertures of the lower concentrator and $\theta_{max}$ is replaced by $\theta_{max}'$. The new angle $\theta_{max}'$ is chosen to satisfy the following relation:

$$\theta_{max}' = \arcsin n_1/n_2 \qquad (3)$$

where $n_2$ and $n_2$ are respectively the indices of refraction of the medium in the upper concentrator, i.e., air, and the cooling liquid 30 in the lower concentrator, and $n_2$ is greater than $n_1$. The index of refraction of plate 28 may be ignored since, because it is relatively thin and also flat on both sides, the plate has no concentrating effect. With $n_2$ exceeding $n_1$, the light is concentrated by the two concentrators by a factor of $(n_2/n_1)(1/\sin\theta_{max})$.

FIG. 6 illustrates the path followed by a typical light ray entering the entrance aperture of the upper concentrator. The entering ray identified as 74 strikes the inner surface 66 of the upper concentrator and is reflected as shown by transit leg 76 down to the transparent plate 28. Due to the difference in the refractive indices of plate 28 and the air in the upper concentrator, the ray undergoes a change of direction as shown at 78 as it passes through plate 28. It undergoes a further change of direction as it passes into cooling fluid 30 due to a difference between the indices of refraction of plate 28 and cooling fluid 30. The light ray passes through fluid 30 as 80 and strikes the inner surface 60 of the lower concentrator where it is reflected as shown at 82 back into the liquid and down through the exit aperture of the lower concentrator onto one of the solar cells of panel 6. By properly designing the two concentrators in the manner above described, the concentrator assembly can concentrate light on the solar cells by a factor of at least 10, and if the concentrators are properly oriented, such concentration is effected without the need for diurnal tracking as explained by Winston (supra).

Inasmuch as the tangent to the fully developed profile curve turns parallel to the optic axis at the upper edge, the length of the collector can be shortened substantially below the value given in equation (2) with very little loss of entrance aperture. When the collector is truncated, i.e. its length is shortened, the angular acceptance is not diminished; only the concentration is slightly reduced. Such shortening can result in significant saving of material.

In accordance with this invention, the conduits 36 and 38 are connected in a closed loop with a pump (not shown) and a cooling facility (also not shown) whereby cooling fluid is continually circulated through the lower concentrator at a rate which assures that the lower concentrator is kept filled. Any heating occurring as a result of absorption of solar energy by either the solar cells or the concentrators or as a result of electrical resistance heating in the solar cells is rapidly compensated for by the circulating cooling fluid which picks up heat by conduction from the walls of the lower concentrator and the solar cell panel and gives up such heat when it is cooled in the cooling facility. The latter may be a refrigeration type cooler or may be merely a simple heat exchanger wherein heat is removed by exchange with a secondary cooling liquid or by radiation to the atmosphere. In any event, the fluid 30 functions as a light transmitting medium as well as a cooling medium. Obviously the heat transmitted to the coolant need not be discarded, but can be utilized in and of itself to provide hot water or space heating.

Figure 5:
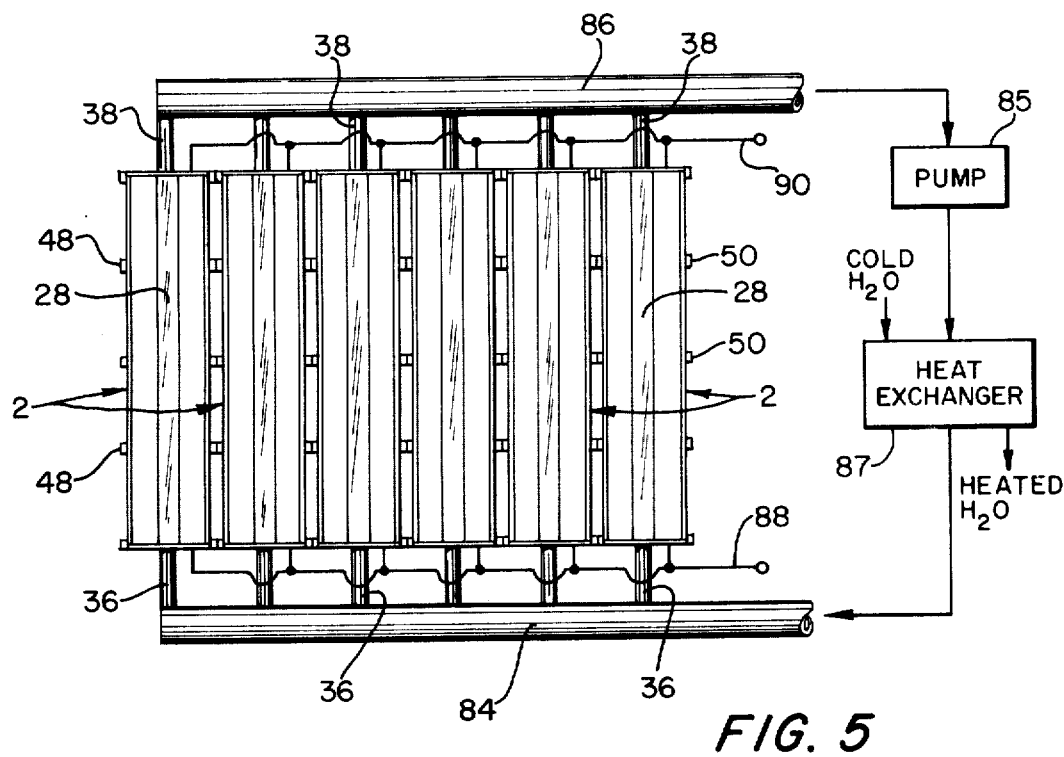
FIG. 5 is a plan view showing a number of the devices of FIG. 1 disposed in parallel.

FIG. 5 illustrates how a number of the units shown in FIGS. 1-4 may be connected into a common coolant circulating system. In this case the several dual concentrator assemblies are disposed side by side with their conduits 36 connected to an inlet manifold 84 and their conduits 38 connected to an outlet manifold 86. Manifolds 84 and 86 are connected to a circulating pump 85 and a cooling facility which is exemplified as a heat exchanger 87, whereby coolant is continually circulated in a parallel mode through the several lower concentrators via conduits 36 and 38 to absorb heat and through the heat exchanger to give up the absorbed heat. By way of example, heat exchanger 87 may be of the type through which water is circulated to pick up heat, whereby it functions as a water heater with the heated water being usable for domestic or industrial purposes. Of course, if desired, the coolant circulating system may be modified so that the coolant passes through the several lower concentrators serially instead of in the parallel mode just described. An incidental advantage of a multiple unit array as shown in FIG. 5 is that the adjacent concentrator assemblies may be tied together, e.g., by connecting together the ribs 48 of one assembly with the ribs 50 of the adjacent assembly, so as to form an integrated and strong structure. It is to be understood also that the solar cells associated with the several concentrator assemblies are interconnected electrically in parallel or series relation according to the power requirements of a particular installation. Thus, by way of example, if each panel 6 comprises a group of solar cells interconnected in series, a parallel-series power matrix may be achieved by coupling the several groups in parallel between a pair of conductors 88 and 90 which connect the power matrix to an exterior circuit.

FIG. 7 shows a modification of the invention. In this case the lower concentrators 4 are anchored to a substrate 96 and the upper ends of the adjacent side walls of the upper concentrators engage and are secured to each other so as to form passageways 98 through which an auxiliary cooling medium such as air may be circulated to provide additional cooling of the concentrators. As a further option, cooling fins 100 may be attached to the upper and/or lower concentrators to radiate heat away from the concentrators. Fins 100 are made of a suitable heat conductive material, e.g., aluminum, and may be attached in one of several ways known to persons skilled in the art, e.g., by riveting or welding. In this modification the cooling medium 30 may be circulated as previously described or it may be stationary, in which case it cools by transmitting heat from the solar cells on panels 6 to the walls of the lower concentrator.

FIG. 8 illustrates how cooling of the solar cells by a dielectric cooling medium can be achieved where the solar cells are associated with a single concentrator. In FIG. 8, the concentrator 102 is substantially the same as the upper concentrator 2 of FIG. 1 except that it is filled with a dielectric cooling medium 30, its entrance aperture is closed off by a transparent glass or plastic cover plate 104, and the solar cell panel 6 is mounted in the exit aperture of the concentrator. The plate 104 and panel 6 are hermetically sealed to the side and end walls of the concentrator so as to prevent leakage of the cooling medium. The latter is circulated through the concentrator via conduits connected to ports 106 formed in the end walls of the concentrators. In this case the angular acceptance is increased because the index of refraction of the dielectric cooling medium ($n_2$) exceeds that of air ($n_1$). This increased angle of acceptance ($\theta_{max}''$) is given by the relation:

$$\theta_{max}'' = \arcsin\left[(n_2/n_1) \sin \theta_{max}\right] \qquad (4)$$

where the angle $\theta_{max}$ specifies the profile curve of the concentrator in the sense of equations (1) and (2).

Figure 9:
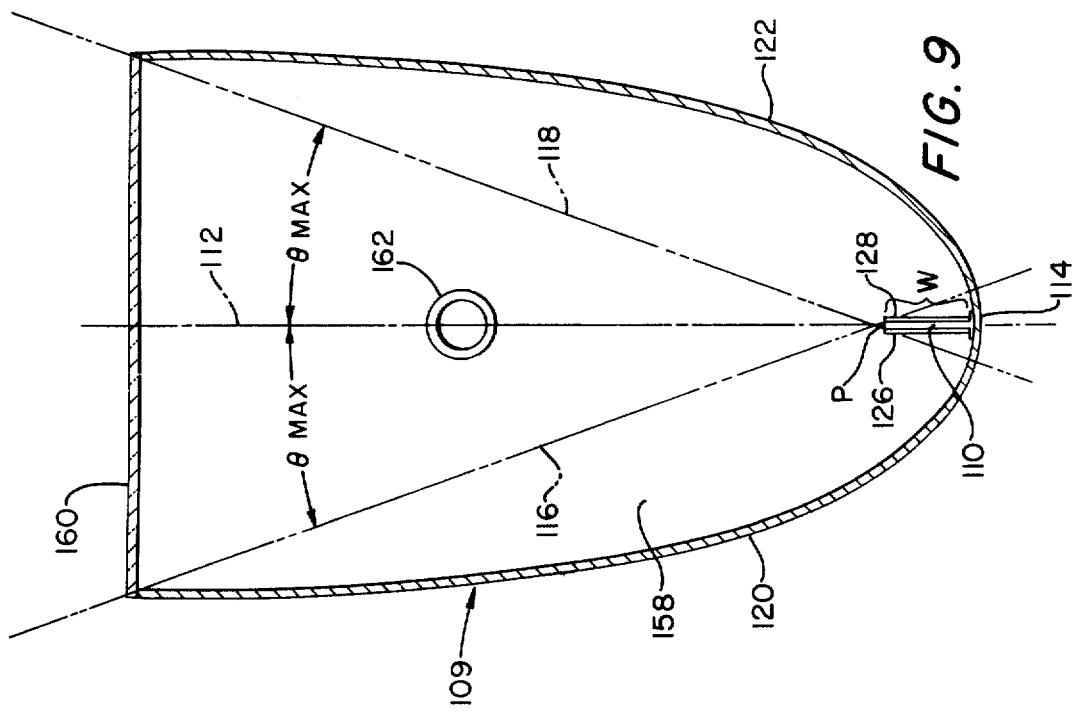

FIG. 9 illustrates a trough-like concentrator 109 having a flat solar cell support member 110 which extends lengthwise of the concentrator and is disposed so that its opposite sides extend parallel to and are equally spaced with the center or optic axis 112. The bottom wall portion 114 of the concentrator extending between dashed lines 116 and 118 has the shape of an arc of a circle of radius W centered at P. The remaining side wall portions 120 and 122 of the concentrator are parabolas with foci at P, so that radiant energy received at an angle $\theta_{max}$ is reflected tangent to the upper edge of the substrate which extends lengthwise of the concentrator. Two solar cell panels 126 and 128 are mounted on opposite sides of support member 110 so that they are in back to back relation. With this arrangement, energy entering the collector between the dashed lines 116 and 118 at an angle less than $\theta_{max}$ is directed onto one or the other of the solar cell panels.

Figure 10:
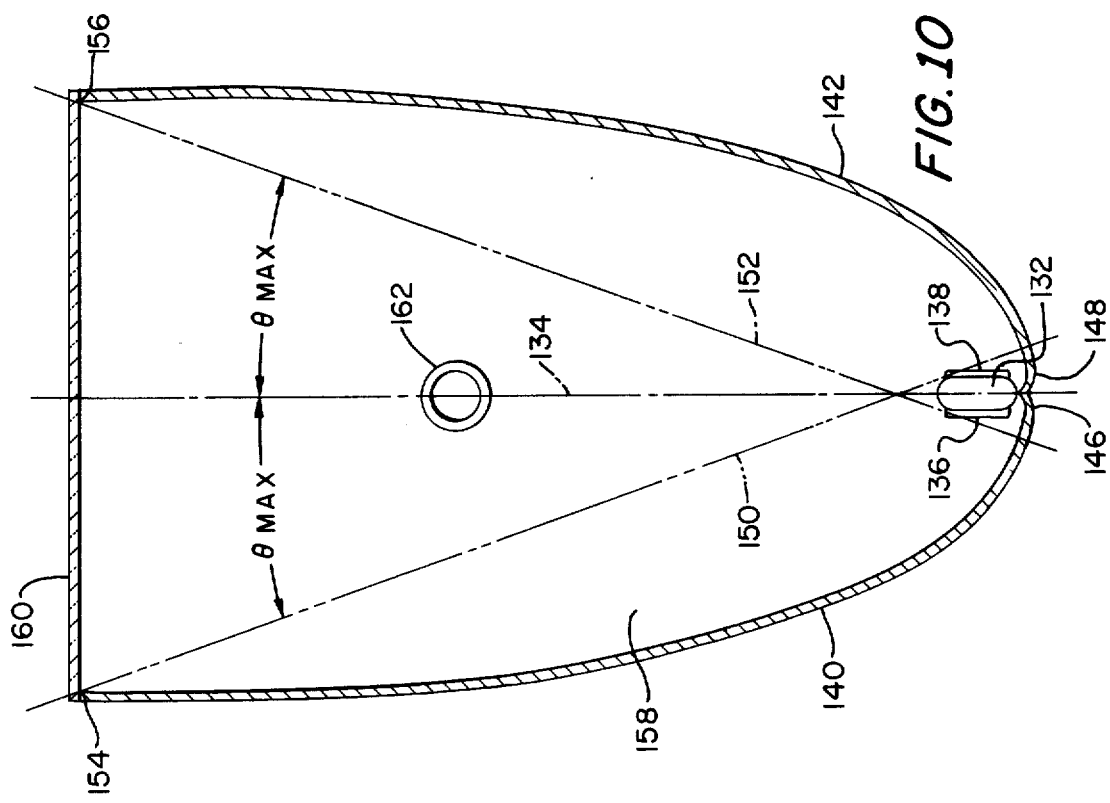

FIG. 10 illustrates a collector having a oval solar cell support member 132 centered on its optic axis 134. Solar cell panels 136 and 138 are mounted to the opposite sides of support member 132. The bottom wall portions 146 and 148 extending between dashed shadow lines 150 and 152 are involutes of the sides of the oval support member 132. The remaining side wall portions 140 and 142 are so shaped as to reflect radiant energy incident at angle $\theta_{max}$ tangent to the oval. Terminal points 154 and 156 are points on the side walls 140 and 142 where the tangent to the side wall is parallel to the optic axis 134. In this arrangement radiant energy entering the collector between shadow lines 150 and 152 at an angle up to but not exceeding $\theta_{max}$ is reflected onto the solar cell panels.

As in the apparatus of FIG. 8, the ends of the concentrators shown in FIGS. 9 and 10 are closed off by vertical end walls 158 and the entrance aperture is closed off by a transparent glass or plastic cover plate 160. The cover plates are hermetically sealed to the side and end walls of the concentrators so as to prevent leakage of the dielectric cooling medium, the latter being circulated through the concentrators via conduits connected to ports as shown at 162 formed in the end walls of the concentrators.

Figure 3:
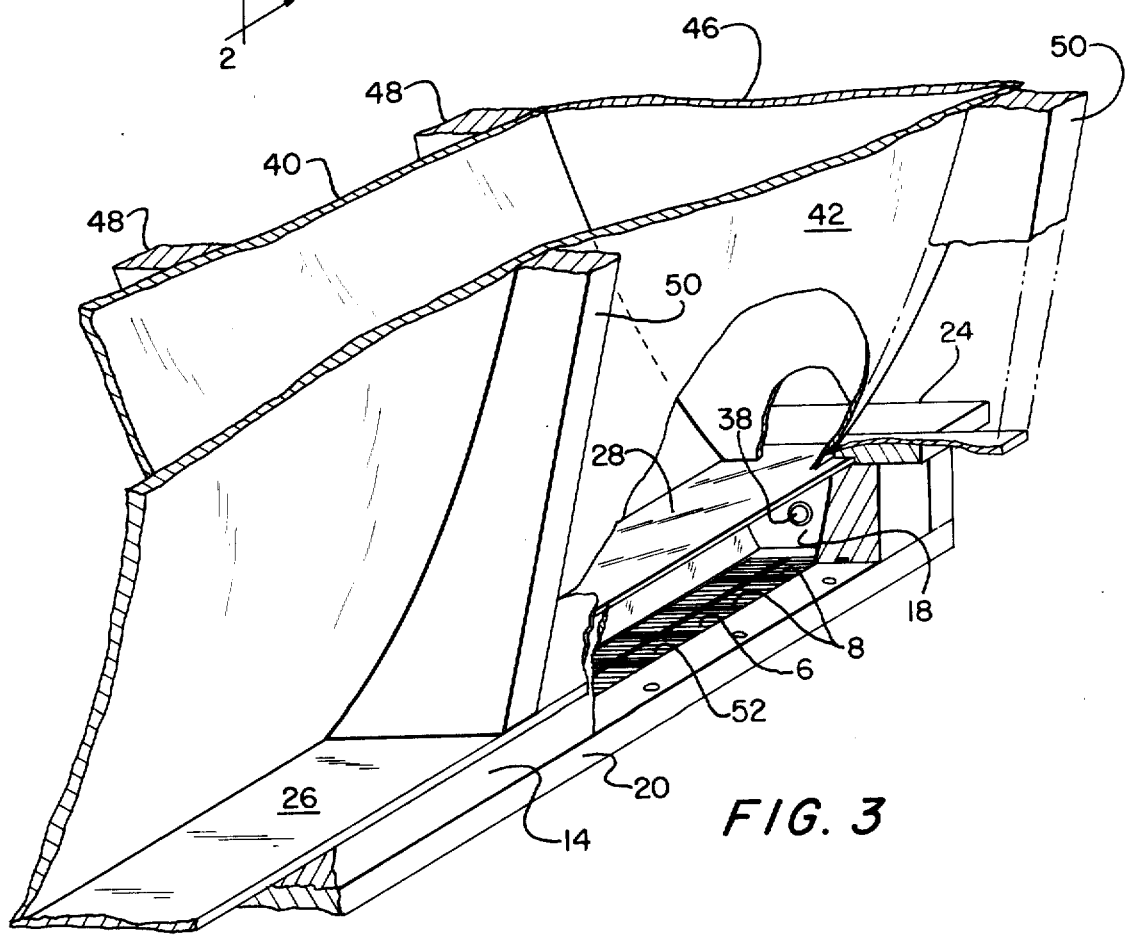
FIG. 3 is an enlargement of a portion of FIG. 1 with a part of the radiant energy concentrator assembly broken away.

It is further contemplated that the lower stage of the two-stage concentrator shown in FIGS. 1-3 may be replaced by a concentrator-solar cell arrangement of the type shown in FIGS. 8, 9 or 10.

Two or more of the single stage concentrators shown in FIGS. 8, 9 and 10 may be disposed side by side as shown in FIGS. 5 and 7, with dielectric cooling fluid circulated through them in parallel or in series as desired. The solar panels of the several units may be connected in parallel or series according to power requirements.

FIG. 11 shows how two groups of solar cells may be mounted in a dual concentrator. In this case the upper concentrator is the same as the upper concentrator 2 of FIGS. 1-4. However, the lower concentrator 109A is similar to the concentrator 109 of FIG. 10, with its side and bottom wall portions 120A, 122A and 114A being shaped in accordance with the teachings of R. Winston, Solar Energy, Vol. 17, No. 4, 1975, "Principles of Cylindrical Concentrators for Solar Energy." Concentrator 109A is provided with flanges 111 along its top edges which are secured to the mounting plate 24 by screws 113. The transparent plate 28 is sandwiched between the upper and lower concentrators and hermetically seals off the lower concentrator so that the latter may be filled with a dielectric cooling fluid via conduits connected to ports 162 in the two end walls. Mounted to the inner surface of bottom wall portion 114A is a dual solar cell assembly represented schematically at 129. It is to be understood that the assembly 129 comprises two solar cell panels corresponding to solar cell panels 126 and 128 of FIG. 9 mounted in back-to-back relation on opposite sides of a support member corresponding to support member 110 (also FIG. 9). As in the arrangement of FIG. 9, the dual solar cell assembly 129 extends lengthwise of the concentrator and is disposed so that the two solar cell panels extend parallel to and are equally spaced with respect to the center or optic axis of the lower concentrator. With this arrangement, light received from the upper concentrator is reflected onto the light sensitive surfaces of the back-to-back solar cell panels in the same manner as is accomplished with the concentrator of FIG. 9.

While the coolant 30 may be a gas, it is preferred that it be a liquid since a gas is incapable of removing heat as efficiently as a liquid. However whether it is a gas or a liquid, the coolant must be a dielectric or non-conductor of electricity since otherwise it might short-circuit the solar cells. Also, the coolant must be transparent to solar energy radiation (or at least to visible and ultraviolet light). It also is essential that the coolant be a material which will not corrode or otherwise attack the solar cells or the collectors. By way of example, the coolant 30 may be ethylene glycol or distilled water.

The invention is not limited to concentrators of the type hereinabove described. Instead, for example, the concentrator may be the so-called Schumann type wherein the sides of the trough-like concentrators are flat inclined mirrors.

Still other concentrators known to persons skilled in the art may be used in practicing the invention.

What is claimed is:

1. Apparatus for converting solar radiation to electrical energy comprising means defining a closed chamber with a wall capable of passing solar radiation, at least one solar cell disposed in said chamber, first solar radiation concentrator means for receiving solar radiation and directing it through said wall into said chamber, said chamber comprising second solar radiation concentrator means for directing said solar energy onto said at least one solar cell, and a cooling fluid in said chamber, said cooling fluid being (a) electrically non-conductive, (b) capable of passing said solar radiation to said at least one solar cell, and (c) having a higher-than-air index of refraction.

2. Apparatus according to claim 1 and further including means for introducing and removing said cooling fluid from said chamber.

3. Apparatus according to claim 1 wherein said first solar radiation concentrator means is an elongated trough having a top end and a bottom end, and said chamber is located at said bottom end.

4. Apparatus according to claim 3 wherein said wall is at said bottom end of said trough.

5. Apparatus according to claim 3 wherein said at least one solar cell is spaced from said wall.

6. Apparatus according to claim 6 wherein said wall and said solar cell are disposed parallel to one another.

7. Apparatus according to claim 1 wherein said first concentrator means comprises opposed parabolically shaped walls forming a trough having a top end, a bottom end and an entrance aperture at said top end and an exit aperture at said bottom end, and further wherein said chamber is disposed at said exit aperture.

8. Apparatus according to claim 7 wherein said second concentrator means comprises opposed parabolically shaped walls of said chamber forming a trough having a top end adjacent to said exit aperture.

9. Apparatus according to claim 7 wherein said solar cell is spaced from said exit aperture.

10. Apparatus for converting solar radiation to electrical energy comprising means defining a closed chamber with an entrance aperture capable of passing solar radiation, said chamber including walls adapted to reflect said solar radiation onto a predetermined position, at least one solar cell disposed in said chamber in said position to receive said radiation, and a cooling fluid in said chamber in contact with said at least one solar cell, said cooling fluid being (a) electrically non-conductive, (b) capable of transmitting solar radiation from said entrance aperture to said at least one solar cell, and (c) having a higher-than-air index of refraction.

11. Apparatus according to claim 10 wherein said chamber has an exit aperture and said at least one solar cell is disposed at said exit aperture.

12. Apparatus according to claim 10 wherein a section of at least one of said walls has a parabolic curvature.

* * * * *